(12) United States Patent
Le et al.

(10) Patent No.: US 6,594,609 B1
(45) Date of Patent: Jul. 15, 2003

(54) SCAN VECTOR SUPPORT FOR EVENT BASED TEST SYSTEM

(75) Inventors: Anthony Le, Santa Clara, CA (US); Rochit Rajsuman, Santa Clara, CA (US)

(73) Assignee: Advantest, Corp., Tokyo (JP)

( * ) Notice: Subject to any disclaimer, the term of this patent is extended or adjusted under 35 U.S.C. 154(b) by 171 days.

(21) Appl. No.: 09/721,828

(22) Filed: Nov. 25, 2000

(51) Int. Cl.[7] .............................................. G01R 31/00
(52) U.S. Cl. ...................................... 702/117; 714/731
(58) Field of Search ............................ 702/58, 59, 117, 702/118, 120, 124, 125, 126, 183, 186, 189; 714/731, 732, 726, 729

(56) References Cited

U.S. PATENT DOCUMENTS

| | | | | |
|---|---|---|---|---|
| 4,855,670 A | * | 8/1989 | Green ........................ | 324/73.1 |
| 5,592,493 A | * | 1/1997 | Crouch et al. .............. | 714/729 |
| 5,825,785 A | * | 10/1998 | Barry et al. ................ | 714/732 |
| 6,049,901 A | * | 4/2000 | Stock et al. ................ | 714/726 |
| 6,226,765 B1 | | 5/2001 | Le et al. | |
| 6,360,343 B1 | * | 3/2002 | Turnquist ................... | 714/731 |

OTHER PUBLICATIONS

Rochit Rajsuman "Digital Hardware Testing: Transistor–Level Fault Modeling and Testing" PP 197–239, Artech House 1992.

* cited by examiner

*Primary Examiner*—Marc S. Hoff
*Assistant Examiner*—Mohamed Charioui
(74) *Attorney, Agent, or Firm*—Muramatsu & Associates (57) ABSTRACT

An event based test system can generate scan vectors for testing a semiconductor device of scan design without requiring a large amount of scan memory. The test system includes an event memory for storing timing data and event type data of each event where the timing data is expressed by N data bits for defining one test vector, an event generator for generating an event with use of the timing data and the event type data, and a mode change circuit provided between the event memory and the event generator for changing signal paths between a normal mode for generating the test vectors and a scan mode for generating the scan vectors. In the test system, each bit of the N data bits in the event memory defines $2^N$ scan vectors which are provided to the event generator in a series fashion, thereby producing the $2^N$ scan vectors at each access of the event memory.

10 Claims, 8 Drawing Sheets

| Event | Delay | Delay Count | Delay Vernier | Event Type |
|---|---|---|---|---|
| 0 | $\Delta V_0$ | C0 | V0 | Drive Logical Low |
| 1 | $\Delta V_1$ | C1 | V1 | Drive Logical High |
| 2 | $\Delta V_2$ | C2 | V2 | Drive Logical Low |
| 3 | $\Delta V_3$ | C3 | V3 | Drive Logical High |
| 4 | $\Delta V_4$ | C4 | V4 | Drive Logical Low |
| 5 | $\Delta V_5$ | C5 | V5 | Drive Logical High |
| 6 | $\Delta V_6$ | C6 | V6 | Drive Logical Low |
| 7 | $\Delta V_7$ | C7 | V7 | Drive Logical High |

Event Memory

17 — 10 : Coarse Delay
9 — 3 : Fine Delay
2 — 0

| Event | Event Word | Event Type |
|---|---|---|
| 0 | A | Scan |
| 1 | B | Scan |
| 2 | C | Scan |

Event Memory spans bits 17 to 0; Event Word occupies bits 17–3, Event Type occupies bits 2–0.

Fig. 7B

| Scan Events (Total $2^{15}$ Vectors) | 1 1 1 |
|---|---|

Bits 17 to 3, and bits 2 to 0.

Fig. 7C

| For bits 0-2 Code | Event Type |
|---|---|
| 0 0 0 | No Operation |
| 0 0 1 | Drive High |
| 0 1 0 | Drive Low |
| 0 1 1 | Drive Z |
| 1 0 0 | Strobe High |
| 1 0 1 | Strobe Low |
| 1 1 0 | Strobe Z |
| 1 1 1 | Reserved for Scan |

Fig. 8

SCAN VECTOR SUPPORT FOR EVENT BASED TEST SYSTEM

FIELD OF THE INVENTION

This invention relates to an event based test system for testing semiconductor devices, and more particularly, to an event based test system which can generate scan vectors for testing a semiconductor device of scan design without requiring a large amount of scan memory.

BACKGROUND OF THE INVENTION

In testing semiconductor devices such as ICs and LSIs (Large Scale Integrated circuits) by a semiconductor test system, such as an IC tester, a semiconductor IC device to be tested is provided with test signals or test patterns produced by an IC tester at its appropriate pins at predetermined test timings. The IC tester receives output signals from the IC device under test in response to the test signals. The output signals are strobed or sampled by strobe signals with predetermined timings to be compared with expected data to determine whether the IC device functions correctly or not.

For improving test efficiency, scan design is one of approaches established in integrated circuit design (design for test). The present invention is directed to an event based test system for testing IC devices with or without such scan design. Before going into further details of the problems involved in a conventional semiconductor test system for generating scan vectors for the scan design IC devices under test, brief description will be made in the following as to an, example of test signals and associated circuit structure in the semiconductor test system.

Traditionally, timings of the test signals and strobe signals are defined relative to a tester rate or a tester cycle of the semiconductor test system. Such a test system is sometimes called a cycle based (or cyclized) test system. Another type of test system is called an event based test system wherein the desired test signals and strobe signals are produced by event data from an event memory directly on a per pin basis. The present invention is directed to such an event based semiconductor test system.

In an event based test system, notion of events are employed, which are any changes of the logic state in the signals to be used for testing a semiconductor device under test. For example, such changes are rising and falling edges of test signals, or timing edges of strobe signals. The timings of the events are defined with respect to a time length from a reference time point. Typically, such a reference time point is a timing of the previous (last) event. Alternatively, such a reference time point is a fixed start time common to all of the events.

In an event based test system or an event tester, since the timing data in a timing memory (event memory) does not need to include complicated information regarding waveform, vector, delay and etc., relative to each and every test cycle, the description of the timing data can be dramatically simplified. However, it generally requires a large memory capacity for storing the timing data in the event memory.

Figure 3A:
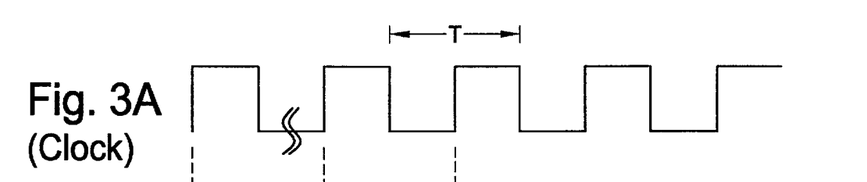
FIGS. 3A–3E are timing charts showing timing relationships among various events including the drive event and sampling event relative to a reference clock for showing the basic concept of an event timing relationship.

In an event based test system, the timing (event) data for each event stored in an event memory is expressed, for example, by a time difference between the current event and the last event. For producing high resolution timings, the time length (delay value) between the events is defined by a combination of an integer multiple of a reference clock cycle (integer part or event count) and a fraction of the reference clock cycle (fractional part or event vernier). A timing relationship between the event count and the event vernier is shown in timing charts of FIGS. 3A–3E. In this example, a reference clock (master clock or system clock) of FIG. 3A has a clock cycle (hereafter also referred to as "period") T. Event 0, Event 1 and Event 2 are related in timings as shown in FIG. 3C.

To describe the Event 1 with reference to Event 0, a time difference (delay) $\Delta V_1$ between the two events is defined in an event memory. The timing of Event 2 is defined by a time difference (delay) $\Delta V_2$ from Event 1. Similarly, the timing of Event 3 in FIG. 3E is defined by a time difference (delay) $\Delta V_3$ from Event 3. In the event test system, the timing data in the event memory is read out and summed up to all of the previous events to produce an ultimate timing of the current event.

Figure 3B:
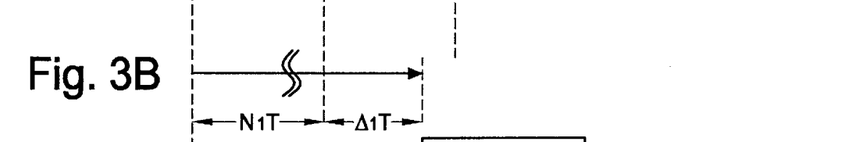
Figure 3C:
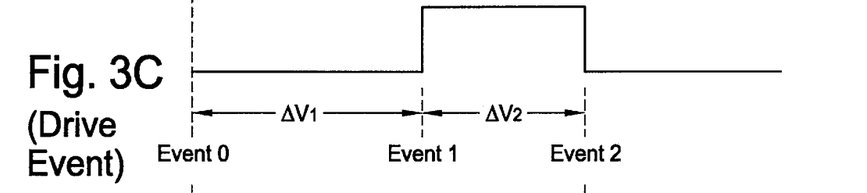

Therefore, in the example of FIG. 3C, to produce Event 1, the timing relationship of FIG. 3B is used in which $N_1 T$ denotes the event count which is $N_1$ times of the reference clock period T and $\Delta_1 T$ denotes the event vernier which is a fraction of the reference clock period T. Similarly to produce Event 3 in FIG. 3E with reference to Event 0, the timing data for all prior events are summed up to produce an overall time difference expressed by $N_3 T + \Delta_3 T$ wherein $N_3 T$ denotes the event count which is $N_3$ times the reference clock period T and $\Delta_3 T$ denotes the event vernier which is a fraction of the reference clock period T.

In actual device testing, a test signal for a certain pin of the device under test may not change for a long period of time such as several hundred milliseconds while test signals for most other pins change at much higher rates such as several ten or hundred nanoseconds. This means that the time length between the two adjacent events can be in a very wide variety, requiring large bits of data to describe the maximum possible time length. Since a semiconductor test system is a large system having, for example, several hundred test channels (pins), where each test channel includes an event memory, it is desirable to minimize the capacity of the event memory to decrease the overall cost of the test system.

Such memory reduction is especially important in storing test vectors for testing scan design IC devices. Scan design is well established methodology in the IC design to make the IC device easily testable (design for test). In full-scan methodology, scan flip-flops are used in the circuit instead of ordinary D flip-flop or J-K flip-flop. The scan flip-flop contains a multiplexer that allows them to connect in a shift register mode during the test.

Figure 6:
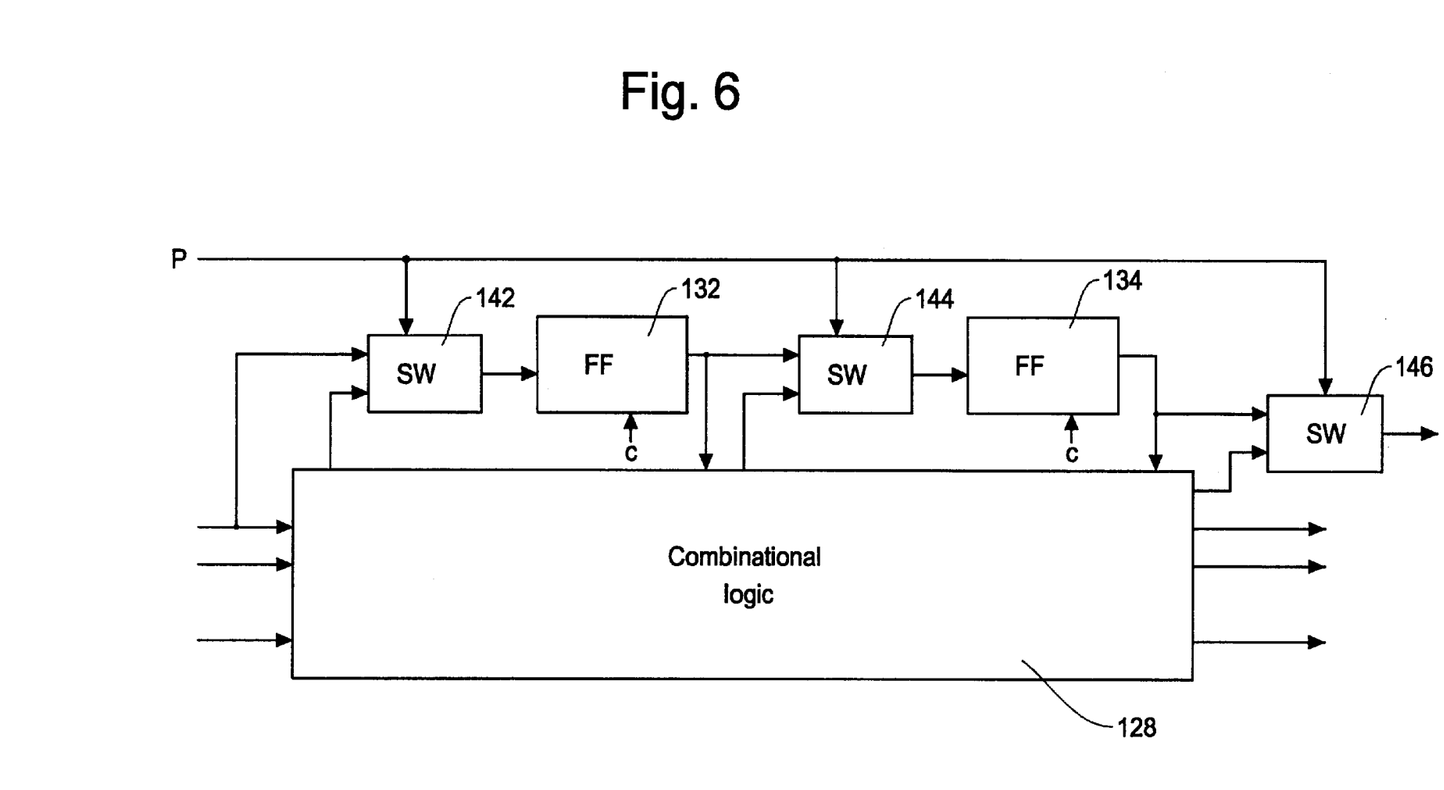
FIG. 6 is a block diagram showing an example of basic circuit structure in an IC device incorporating a scan design concept.

FIG. 6 shows an example of basic scan structure in an IC device incorporating the scan design concept. In this example, a pair of scan flip-flop 132 and a switch SW (multiplexer) and a pair of scan flip-flop 134 and a switch SW (multiplexer) are shown to test a combinational logic in the semiconductor device under test. This basic structure in the scan design is known in the art, and more detailed description is given in "Digital Hardware Testing", Rochit Rajsuman, Artech House, 1992, pp197–238. In the scan design, the general steps of testing are:

(1) Connect flip-flops in shift register (using test mode) and serially shift-in (scan-in) a test vector.

(2) Switch to normal operational mode and thus apply the value in flip-flops (test vector) to the circuit and capture response in the flip-flops.

(3) Switch back to the test mode and serially shift-out (scan-out) the response for evaluation purpose.

In general, the number of scan vectors is quite large such as 16-million to 128-million. In an event based test system noted above, the test vectors are stored based upon change-in-value (event) and the time when the event occurs. This time information is generally defined with respect to a reference time such as time of power-on or clock start time or with respect to the previous event such as shown in FIGS. 3A–3E. To store large number of-scan vectors (such as 128-million vectors) in this format requires extremely large amount of physical memory.

SUMMARY OF THE INVENTION

Therefore, it is an object of the present invention to provide a scan vector generation method and apparatus in an event based test system for testing an IC device having a scan architecture with use of a small capacity event memory.

In the present invention, the event based test system can generate scan vectors for testing a semiconductor device of scan design without requiring a large amount of scan memory. The event based test system includes an event memory for storing timing data and event type data of each event where the timing data is expressed by a plurality ($\log_2 N$) of data bits for defining one test vector, an event generator for generating an event with use of the timing data and the event type data from the event memory, and a mode change circuit provided between the event memory and the event generator for changing signal paths between a normal mode for generating the test vectors and a scan mode for generating the scan vectors by detecting the scan mode when the event type data from the event memory indicating a predetermined word. In the test system, each bit of the plurality ($\log_2 N$) of data bits in the event memory defines each scan vector, and N data bits are provided to the event generator in a series fashion, thereby producing $2^N$ scan vectors at each access of the event memory.

According to the present invention, the event based test system is capable of producing the scan vectors with use of $\log_2 N$-bit data in a parallel form from the event memory and converts the $\log_2 N$-bit data to serial data of $2^N$-bit, thereby producing $2^N$ scan vectors with use of memory locations corresponding to one test vector.

In the event based test system of the present invention, the timing data in the event memory is comprised of delay count data which is formed with an integer multiple of a reference clock period (integral part data) and delay vernier data which is formed with a fraction of the reference clock period (fractional part data). Further, the timing data for producing the scan vectors is stored in a register provided separately from the event memory and is supplied to the event generator in the scan mode.

The mode change circuit is comprised of a parallel to serial converter for converting the plurality ($\log_2 N$) of data bits from the event memory at each access to $2^N$-bit serial data and a multiplexer for selecting the $2^N$-bit serial data from the parallel to serial converter and providing the $2^N$-bit serial data to the event generator during the scan mode for producing the scan vectors.

DETAILED DESCRIPTION OF THE PREFERRED EMBODIMENT

To facilitate better understanding of the present invention, brief description is given in the following regarding the basic structure of an event based test system and a method of data storage in an event memory in the test system for generating test vectors. Within the context of this invention, the term "test vector" means a test pattern (ex. drive events and strobe events) for testing an ordinary IC device and the term "scan vector" means a test pattern for testing a scan design IC device.

Figure 1:
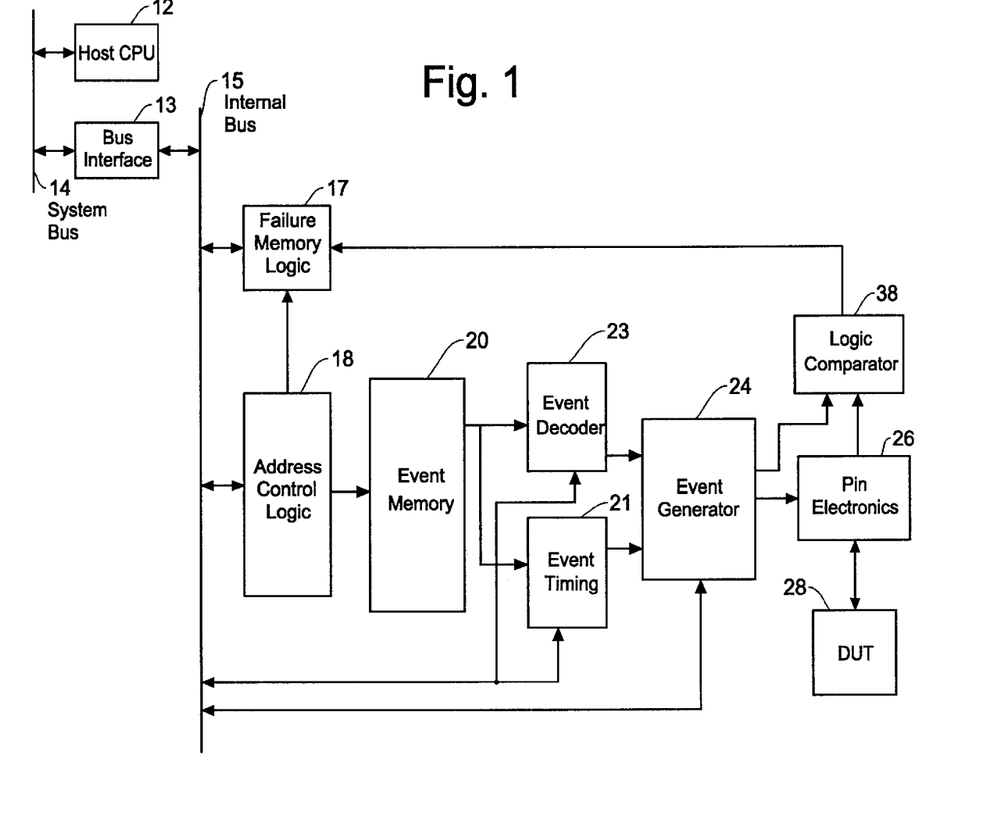
FIG. 1 is a schematic block diagram showing a basic structure of an event based test system to which the scan support of the present invention is applied.

FIG. 1 is a schematic block diagram showing an example of basic structure in an event based test system. The event based test system includes a host computer 12 and a bus interface 13 both are connected to a system bus 14, an internal bus 15, an address control logic 18, a failure memory 17, an event memory 20, an event decoder 23, an event timing unit 21, an event generator 24, and a pin electronics 26. The event based test system is to evaluate a semiconductor device under test (DUT) 28 connected to the pin electronics 26.

An example of host computer 12 is a work station having a UNIX operating system therein. The host computer 12 functions as a user interface to enable a user to instruct the start and stop operation of the test, to load a test program and other test conditions, or to perform test result analysis in the host computer. The host computer 12 interfaces with a hardware test system through the system bus 14 and the bus interface 13. Although not shown, the host computer 12 is preferably connected to a communication network to send or receive test information from other test systems or computer networks.

The internal bus 15 is a bus in the hardware test system and is commonly connected to most of the functional blocks such as the address control logic 18, failure memory 17, event timing unit 21, event decoder 23, and event generator 24. An example of address control logic 18 is a tester processor which is exclusive to the hardware test system and is not accessible by a user. The address control logic 18 provides instructions to other functional blocks in the test system based on the test program and conditions from the host computer 12. The failure memory 17 stores test results, such as failure information of the DUT 28, in the addresses defined by the address control logic 18. The information stored in the failure memory 17 is used in the failure analysis stage of the device under test.

Figure 5:
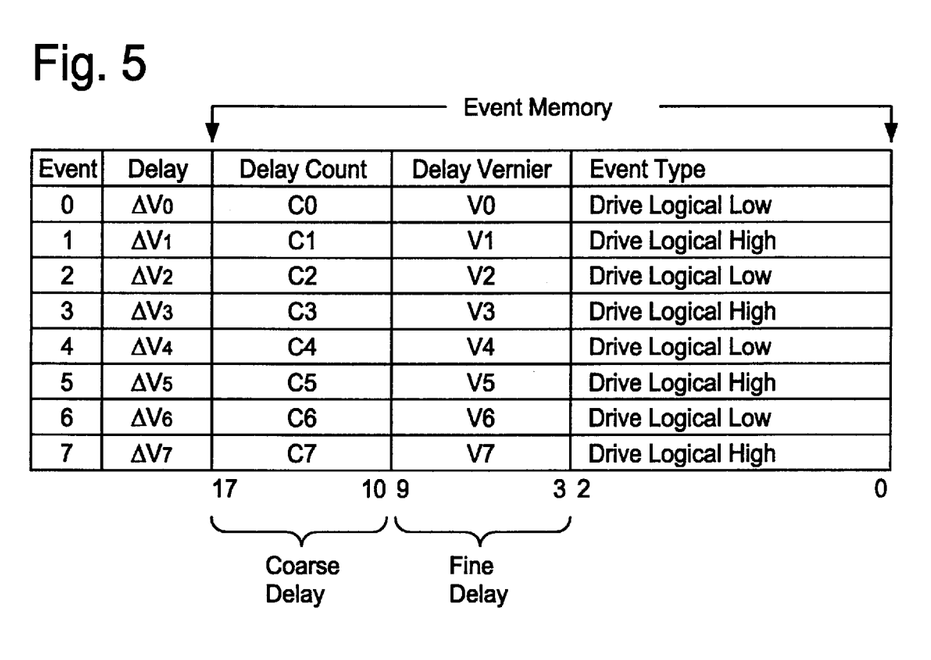
FIG. 5 is a diagram showing an example of data storage in an event memory in the event based test system which defines the series of delays shown in FIG. 4.

The address control logic 18 provides address data to the event memory 20 as shown in FIG. 1. In an actual test system, a plurality of event memories will be provided, each of which may correspond to a test pin of the test system. The event memory stores the timing data for each event of the test signals and strobe signals. The event memory 20 stores the timing data composed of an integer multiple of the reference clock (delay count) and a fraction of the reference clock (delay vernier) as shown in FIG. 5. The event memory 20 also stores event type data (drive, strobe, etc.) which is provided to the event decoder 24.

The event timing unit 21 is to produce data showing overall timing of each event based on the timing data from the event memory 20. Basically, such overall timing data is produced by summing the delay count data and the delay vernier data. During the process of summing the timing data, a carry over operation of the fractional data (offset to the delay count data) is also conducted in the event timing unit 21. Further, during the process of producing the overall timing, timing data can be modified by a scaling factor so that the overall timing is scaled accordingly.

The event decoder 23 decodes the event type data indicating an event type and provides the event type information to the event generator 24. The event generator 24 is to actually generate the events based on the overall timing data from the event timing unit 21 and the event type from the event decoder 23. The events (test signals and strobe signals) thus generated are provided to the DUT 28 through the pin electronics 26. Basically, the pin electronics 26 is formed of a large number of components, each of which includes a driver and a comparator as well as switches to establish input and output relationships with respect to the DUT 28.

Figure 2:
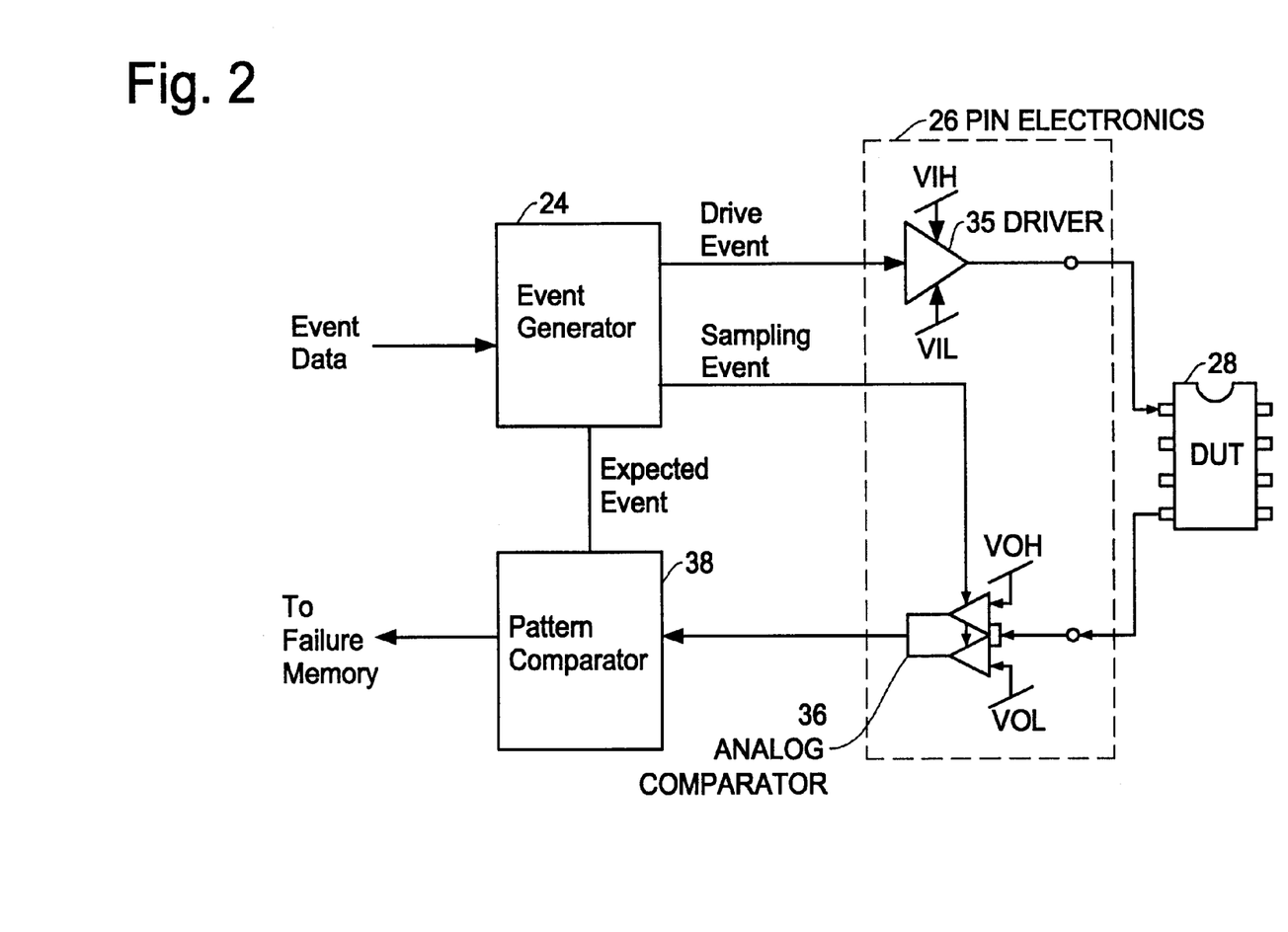
FIG. 2 is a block diagram showing a more detailed structure concerning the pin electronics of FIG. 1 and associated drive events (test signal) and sampling event (strobe signal) from the event-generator.

FIG. 2 is a block diagram showing a more detailed structure in the pin electronics 26 having a driver 35 and an analog comparator 36. The event generator 24 produces drive events which are provided to an input pin of the DUT 28 as a test signal through the driver 35. The event generator 24 further produces a sampling event which is provided to the analog comparator 36 as a strobe signal for sampling an output signal of the DUT 28. The output signal of the analog comparator 36 is compared with the expected data from the event generator 24 by a pattern comparator 38. If there is a mismatch between the two, a failure signal is sent to the failure memory 17 in FIG. 1.

Figure 3D:
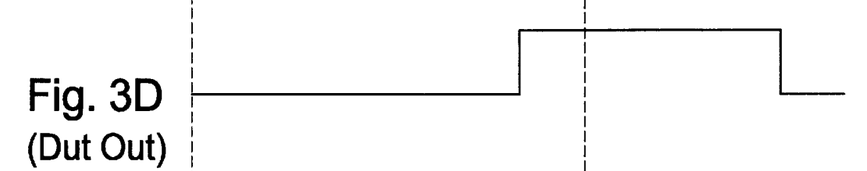
Figure 3E:
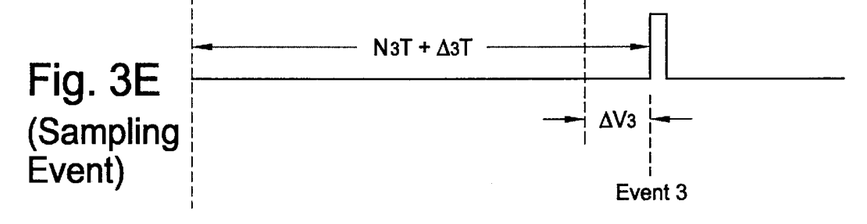

An example of waveforms of the drive events (test pattern), output signal from the DUT, and sampling event (strobe signal) is shown in FIGS. 3C, 3D and 3E, respectively. When applying the drive events of FIG. 3C to the DUT 28 through the driver 35, in response thereto, the DUT 28 produces the output signal shown in FIG. 3D which is strobed by the timing determined by the sampling event of FIG. 3E. As shown in FIG. 3C, the drive events determine the timings of the rising and falling edges of the test pattern. In contrast, as shown in FIG. 3E, the sampling event determines the timing of the strobe point, i.e., a strobe signal can be produced only by a single event when such an event is indicated as a sampling event by the event type data. This is because a strobe signal has a very narrow pulse width so that it is not practically possible to produce a strobe signal by defining both rising and falling edges thereof.

Figure 4:
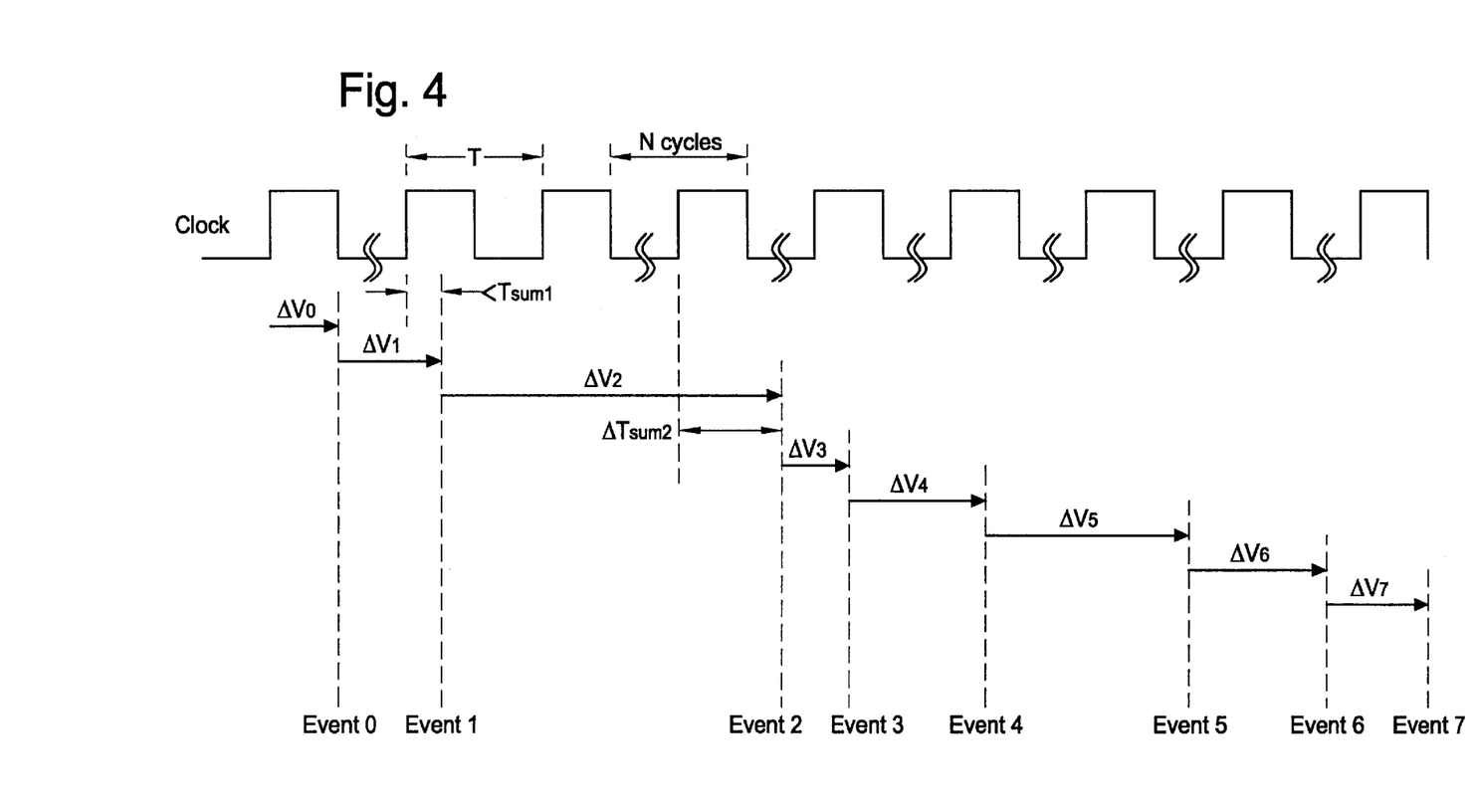
FIG. 4 is a timing chart showing timing relationships among various events based on a time difference (delta time) between two adjacent events.

FIG. 4 is a timing chart showing timing relationships among various events based on a time difference (delta time) between two adjacent events. As noted above with reference to FIGS. 3A–3E, the time length (delay value) between the events is defined by a combination of an integer multiple of a reference clock period (delay count or integral part) and a fraction of the reference clock period (delay vernier or fractional part).

In the example of FIG. 4, Events 0–7 are expressed with reference to the reference clock having a time interval T=1. For example, a delta (delay) time $\Delta V_0$ for Event 0 may be 0.75 (delay count "0", and delay vernier "0.75"), and a delta time $\Delta V_1$ for Event 1 may be 1.50 (delay count "1", and delay vernier "0.50"). In this situation, the total delay of Event 1 will be 2.25 where a logic in the test system counts two event clocks "2.0" and calculates sum of delay vernier "0.25" as the remaining fractional delay.

FIG. 5 is a diagram showing an example of data storage in an event memory in the event based test system which defines the series of delays shown in FIG. 4. The delay time $\Delta V_N$ ($\Delta V_0$, $\Delta V_1$, $\Delta V_2$ . . . ) is expressed by the combination of delay count Cn (C1, C2, C3 , . . . ) and delay vernier Vn (V1, V2, V3, . . . ). The delay count is the number of reference clocks from the reference point of time, i.e., coarse delay. The delay vernier is the number of fine resolution, i.e., fine delay, for example, $1/128$ of reference clock period to express the exact time of the event. For example, for the reference clock of 8 nanoseconds, the finest resolution of 62.5 picosecond is obtained by the delay vernier. The field listed as an event type in FIG. 5 stores event type data which is used to generate different event types during testing.

In this example, each field is assigned with the number of bits shown in FIG. 5. Namely, the delay count (coarse delay) has 8-bits, the delay vernier (fine delay) has 7-bits and the event type has 3-bits. This architecture allows considerable flexibility in event creations. The same architecture can also be used for scan vector generation without additional software support. However, as mentioned above with respect to the background of this invention, scan vectors are typically many times longer than the functional test vectors and thus require addition physical memory to store them.

One possibility is to use large amount of event memory for designated scan pins (test pins connected to scan inputs of the device under test). This solution is however very costly and it eliminates the flexibility of event test system architecture because the dedicated memory is available to only few selected test pins. For example, if an event data (test) pin has 16M events, that would means that it supports 16M scan vector. To support 128M scan vector, the test pin needs to upgrade an event memory from 16M to 128M events. Furthermore, the test pin is dedicated for scan test only and cannot be used for other test purpose.

Figure 7A:
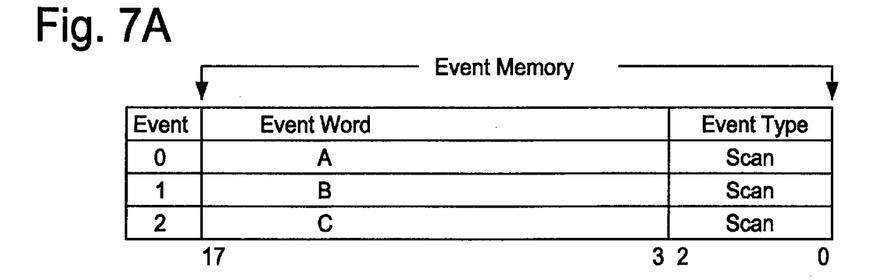
FIGS. 7A–7C are diagrams showing an example of data storage in an event memory in the event based test system of the present invention for storing scan vectors.

In the present invention, the inventors provide a different method to structure words in the event memory for generating the scan vectors. FIG. 7A shows such a word structure in the event memory for scan vectors. In this structure, the 3-bit field (event type in FIG. 5) is reserved for identifying the event type. In this example, in FIG. 7B, this reserved-field is illustrated as "111" which indicates an event scan mode as the event type. This means that when the least significant bits of the event word shows the value "111", all other bits can be used for scan vector support without any confusion on other event types or delay count/delay vernier. Other values in the 3-bit field are shown in FIG. 7C for specifying the event types.

Figure 7B:
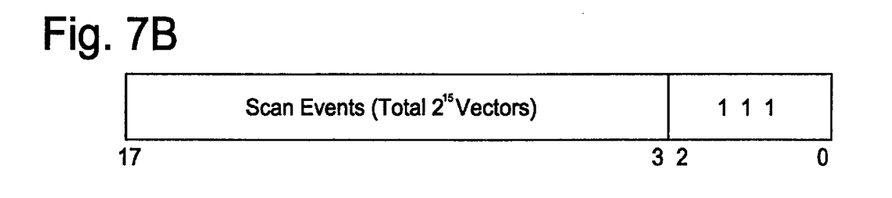
Figure 7C:
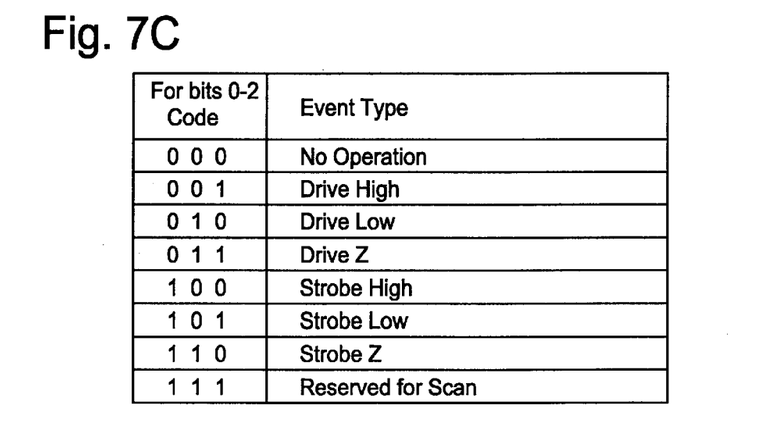

For the example shown in FIGS. 7A and 7B, one event memory location "scan event" can contain a 15-bit long field to identify total of $2^{15}$ vectors. This is a dramatic improvement from one (1) scan vector stored in the structure of FIG. 5.

Figure 8:
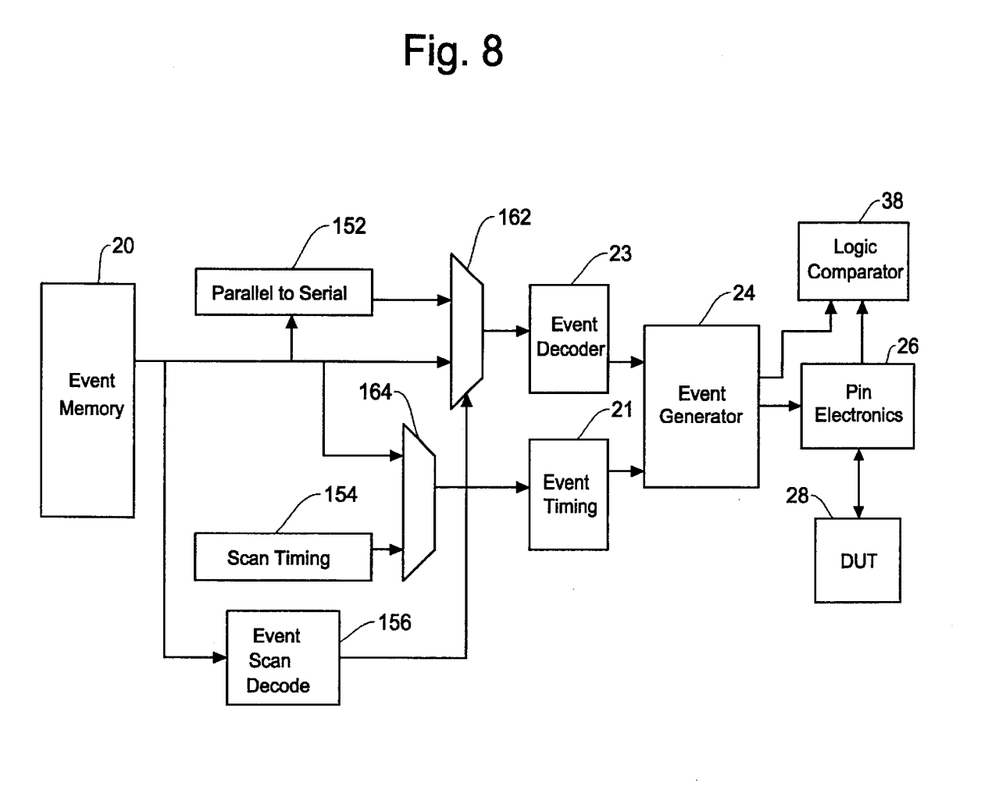
FIG. 8 is a block diagram showing an example of circuit arrangement for enabling switchable generation of either normal test vectors or scan vectors by the event based test system of the present invention.

The timing to generate the scan event is determined by timing data stored in a separate timing register (shown in FIG. 8). FIG. 8 is a block diagram showing a hardware structure (mode change circuit) arranged between the event memory 20 and the pair of event decoder 23 and event timing unit 21. The major purpose of the additional hardware is to change the signal paths between the normal mode (test vector generation) and the event scan mode (scan vector generation) FIG. 8 essentially illustrates that, by inclusion of a very small hardware and restructuring of the event word as shown in FIGS. 7A and 7B, $2^{15}$ scan vectors can be stored per event word instead of one (1) scan vector in the original form of The additional hardware in FIG. 8 includes a parallel to serial converter 152, a scan timing register 154 (data storage), an event scan decoder 156 and multiplexers 162 and 164. When the event word from the event memory 20 shows the value indicating an event scan mode, such as "111" in the above example, the event scan decoder 156 changes logic states of a select signal to the multiplexers 162 and 164. The data from the event memory 20 is converted to serial data, i.e., scan vectors, by the parallel to serial converter 152. Thus, in the event scan mode, the scan vectors are transferred to the event generator 24 through the multiplexer 162 and the event decoder 23. The timings of the scan vectors are controlled by the timing data stored in the scan timing register 154 which is provided to the event timing unit 21 through the multiplexer 164.

In the foregoing example from FIG. 5 to FIG. 8, an 18-bit word has been used to illustrate the event word in which a 3-bit field is used to designate the event type. However, it should be noted that these numbers are used for illustration purpose only and any size of event word and fields can be used in accordance with the present invention.

As has been described, according to the present invention, the major benefit of the present invention is that $2^N$ times more scan vectors can be supported on the event based test system without increasing the physical size of the event memory, where N is the number of bits dedicated in the event word to specify coarse and fine delay. The present invention also allows scan support embedded in the normal event program flow and does not require dedicated scan pin, i.e., every test pin can be a scan pin.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. An apparatus in a semiconductor test system for generating test vectors for a normal test of semiconductor devices and scan vectors for a scan test of semiconductor devices, comprising:

an event memory for storing timing data and event type data of each event wherein the timing data of a current event is expressed by a delay time from a predetermined reference point with use of N data bits in parallel, thereby defining one test vector, wherein the N data bits are divided into two fields of the timing data, one for defining an integer multiple of a reference clock, and another for defining a fraction of the reference clock;

an event generator for generating an event with use of the timing data and the event type data from the event memory where each event is used as a test vector or a scan vector; and a mode change circuit provided between the event memory and the event generator for changing signal paths between a normal mode for generating the test vectors and a scan mode for generating the scan vectors, the mode change circuit detecting the scan mode when the event type data from the event memory indicating a predetermined word;

wherein each bit of the N data bits in the event memory defines each scan vector, and the N data bits read from the event memory in parallel are converted to a serial form by said mode change circuit and are provided to the event generator, thereby producing $2^N$ scan vectors at each access of the event memory.

2. An apparatus in a semiconductor test system as defined in claim 1, wherein the timing data in said two fields of the event memory is comprised of delay count data which is the integer multiple of the reference clock period (integral part data) and delay vernier data which is the fraction of the reference clock period (fractional part data).

3. An apparatus in a semiconductor test system as defined in claim 1, wherein timing data for producing the scan vectors is stored in a data storage provided separately from the event memory and is supplied to the event generator in the scan mode.

4. An apparatus in a semiconductor test system as defined in claim 1, wherein the mode change circuit comprising;

a parallel to serial converter for converting the N data bits in parallel from the event memory at each access to $2^N$-bit serial data; and a multiplexer for selecting the $2^N$-bit serial data from the parallel to serial converter and providing the $2^N$-bit serial data to the event generator during the scan mode for producing the scan vectors.

5. An apparatus in a semiconductor test system as defined in claim 1, wherein the mode change circuit comprising;

a parallel to serial converter for converting the N data bits in parallel from the event memory at each access to $2_N$-bit serial data;

a scan timing register for storing scan timing data for defining timings of the scan vectors;

a first multiplexer for selecting the $2^N$-bit serial data from the parallel to serial converter and providing the $2^N$-bit serial data to the event generator during the scan mode for producing the scan vectors; and a second multiplexer for selecting the scan timing data from the scan timing register and providing the scan timing data to the event generator during the scan mode for producing the scan vectors.

6. An event based semiconductor test system for generating test vectors for a normal test of semiconductor devices and scan vectors for a scan test of semiconductor devices, comprising:

an event memory for storing timing data and event type data of each event wherein the timing data of a current event is expressed by a delay time from a predetermined reference point with use of N data bits in parallel, thereby defining one test vector, wherein the N data bits are divided into two fields of the timing data, one for defining an integer multiple of a reference clock, and another for defining a fraction of the reference clock;

an event generator for generating an event with use of the timing data and the event type data from the event memory where each event is used as a test vector or a scan vector;

a mode change circuit provided between the event memory and the event generator for changing signal paths between a normal mode for generating the test vectors and a scan mode for generating the scan vectors, the mode change circuit detecting the scan mode when the event type data from the event memory indicating a predetermined word;

a pin electronics for supplying the test vectors or scan vectors to predetermined pins of a semiconductor device under test and receiving resultant response outputs of the semiconductor device under test for evaluation relative to expected data;

wherein each bit of the N data bits in the event memory defines each scan vector, and the N data bits read from the event memory in parallel are converted to a serial form by said mode change circuit and are provided to the event generator, thereby producing $2^N$ scan vectors at each access of the event memory.

7. An event based semiconductor test system as defined in claim 6, wherein the timing data in said two fields of the event memory is comprised of delay count data which is the integer multiple of the reference clock period (integral part data) and delay vernier data which is the fraction of the reference clock period (fractional part data).

8. An event based semiconductor test system as defined in claim 6, wherein timing data for producing the scan vectors is stored in a data storage provided separately from the event memory and is supplied to the event generator in the scan mode.

9. An event based semiconductor test system as defined in claim 6, wherein the mode change circuit comprising;

a parallel to serial converter for converting the N data bits in parallel from the event memory at each access to $2^N$-bit serial data; and a multiplexer for selecting the $2^N$-bit serial data from the parallel to serial converter and providing the $2^N$-bit serial data to the event generator during the scan mode for producing the scan vectors.

10. An event based semiconductor test system as defined in claim 6, wherein the mode change circuit comprising;

a parallel to serial converter for converting the N data bits in parallel from the event memory at each access to $2^N$-bit serial data;

a scan timing register for storing scan timing data for defining timings of the scan vectors;

a first multiplexer for selecting the $2^N$-bit serial data from the parallel to serial converter and providing the $2^N$-bit serial data to the event generator during the scan mode for producing the scan vectors; and a second multiplexer for selecting the scan timing data from the scan timing register and providing the scan timing data to the event generator during the scan mode for producing the scan vectors.

* * * * *